United States Patent [19]
Kiani-Shabestari et al.

[11] Patent Number: 5,604,888
[45] Date of Patent: Feb. 18, 1997

[54] EMULATION SYSTEM EMPLOYING MOTHERBOARD AND FLEXIBLE DAUGHTERBOARDS

[75] Inventors: Bijan Kiani-Shabestari, Ascot; John Dunn, Reading; Shaun Lytollis, Patchet, all of United Kingdom

[73] Assignee: Zycad Corporation, Fremont, Calif.

[21] Appl. No.: 224,148

[22] Filed: Apr. 7, 1994

[51] Int. Cl.$^6$ .............................. G06F 17/00; G06F 13/00
[52] U.S. Cl. ..................... 395/500; 364/578; 371/22.2; 371/22.6
[58] Field of Search .................. 395/500, 275, 395/375; 364/578; 371/11.1, 16.2, 22.2, 22.6, 23

[56] References Cited

U.S. PATENT DOCUMENTS

| | | | |
|---|---|---|---|
| 4,315,321 | 2/1982 | Parks III et al. | 395/500 |
| 4,901,259 | 2/1990 | Watkins | 364/578 |
| 4,993,027 | 2/1991 | McGraw et al. | 371/16.2 |
| 5,036,473 | 7/1991 | Butts et al. | 364/489 |
| 5,228,039 | 7/1993 | Knoke et al. | 371/19 |
| 5,329,471 | 7/1994 | Swoboda et al. | 364/578 |
| 5,339,262 | 8/1994 | Rostoker et al. | 364/578 |
| 5,386,550 | 1/1995 | Yumioka et al. | 395/575 |
| 5,408,624 | 4/1995 | Raasch et al. | 395/375 |
| 5,425,036 | 6/1995 | Liu et al. | 371/23 |
| 5,426,738 | 6/1995 | Hsieh et al. | 395/275 |

FOREIGN PATENT DOCUMENTS 2179372 of 1987 United Kingdom.

OTHER PUBLICATIONS

Lee et al., "The Motorola 16–Bil DSP ASIC Core", IEEE 1990, pp. 973–976.
Hasslen et al., "A Validation Strategy for Embedded Core ACIC" IEEE 1990, pp. P5–31–to P5–32.
Pasternak et al., "In–Circuit–Emulation in ASIC Architecture Core Designs", IEEE 1989, pp. P6–4.1 to P6–4.4.
Breuer, Melvin A., ed.; *Design Automation of Digital Systems*, vol. One; Chapter 4, "Partitioning and Card Selection"; Prentice–Hall, Inc.; date unknown; pp. 173–212.
*The Programmable Gate Array Design Handbook*, First Edition; Xilinx, San Jose, California; 1986.
*Proceedings of the IEEE*; Jul., 1993; pp. 1011–1083.

*Primary Examiner*—Kevin J. Teska
*Assistant Examiner*—Tan Nguyen
*Attorney, Agent, or Firm*—Majestic, Parsons, Siebert & Hsue

[57] ABSTRACT

The use of daughterboards connecting to a motherboard in an emulation system allows for the upgrading of the emulation field programmable gate arrays in the system, and for the use of different types of field programmable gate arrays. These changes can be made without changing the motherboard. The motherboard has sockets which have pin locations which are allocated to interconnect structures and to an emulation bus. The chips on the cards can contain different emulation field programmable gate arrays, or could contain core chips, which can be directly connected to the motherboard through the daughterboards. The daughterboards connect the emulation FPGAs and the core chips to the correct pin locations of the sockets. Controller chips on the cards allow for different types of field programmable gate arrays to be used and simplify the configuration loading and debugging of the system. Additionally, the present system includes a system using a reconfigurable interface in a controller chip. This reconfigurable interface allows for different types of field programmable gate arrays to be used in the emulation system.

23 Claims, 4 Drawing Sheets

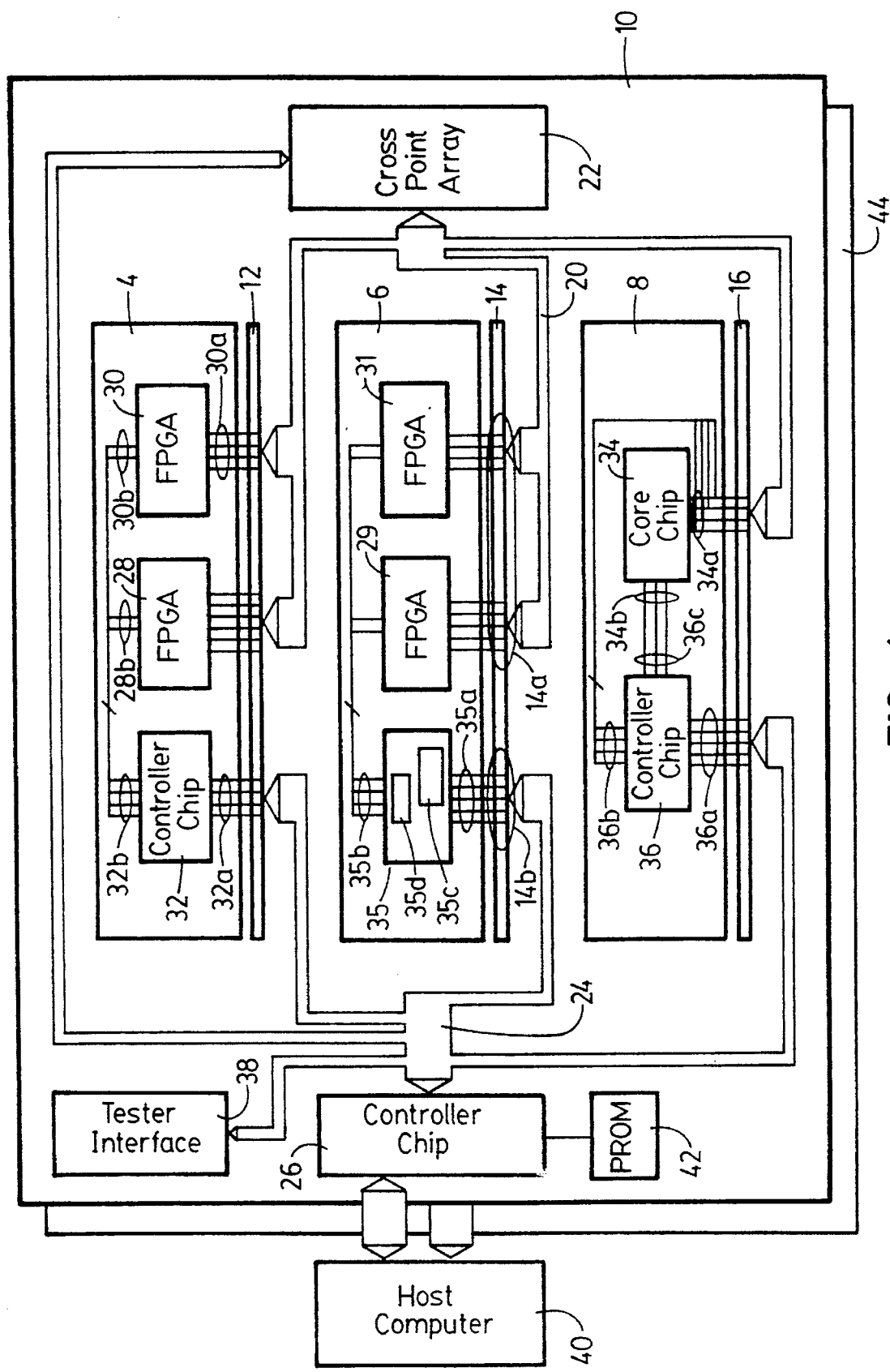
FIG._1.

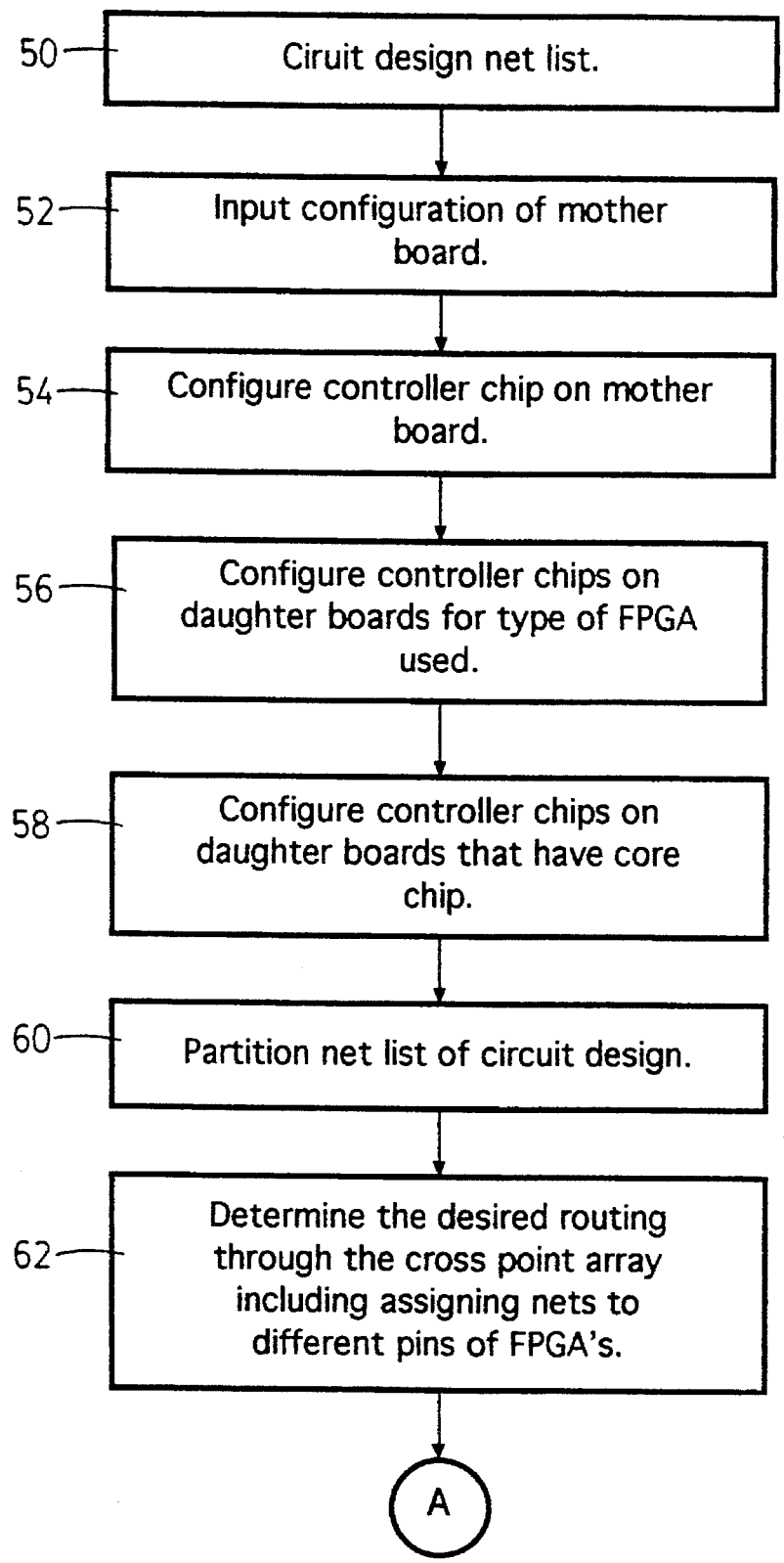
FIG._2A.

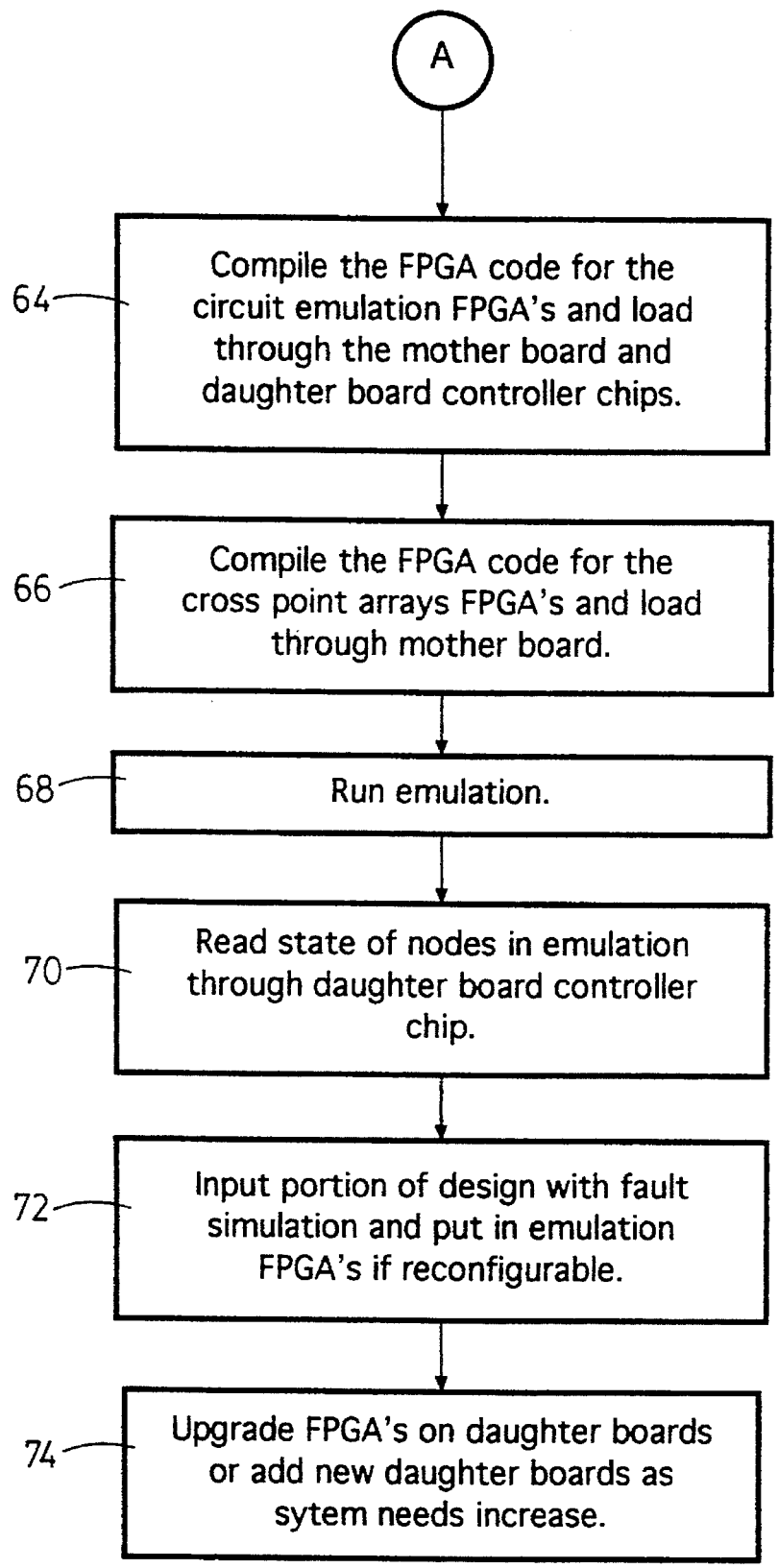
FIG._2B.

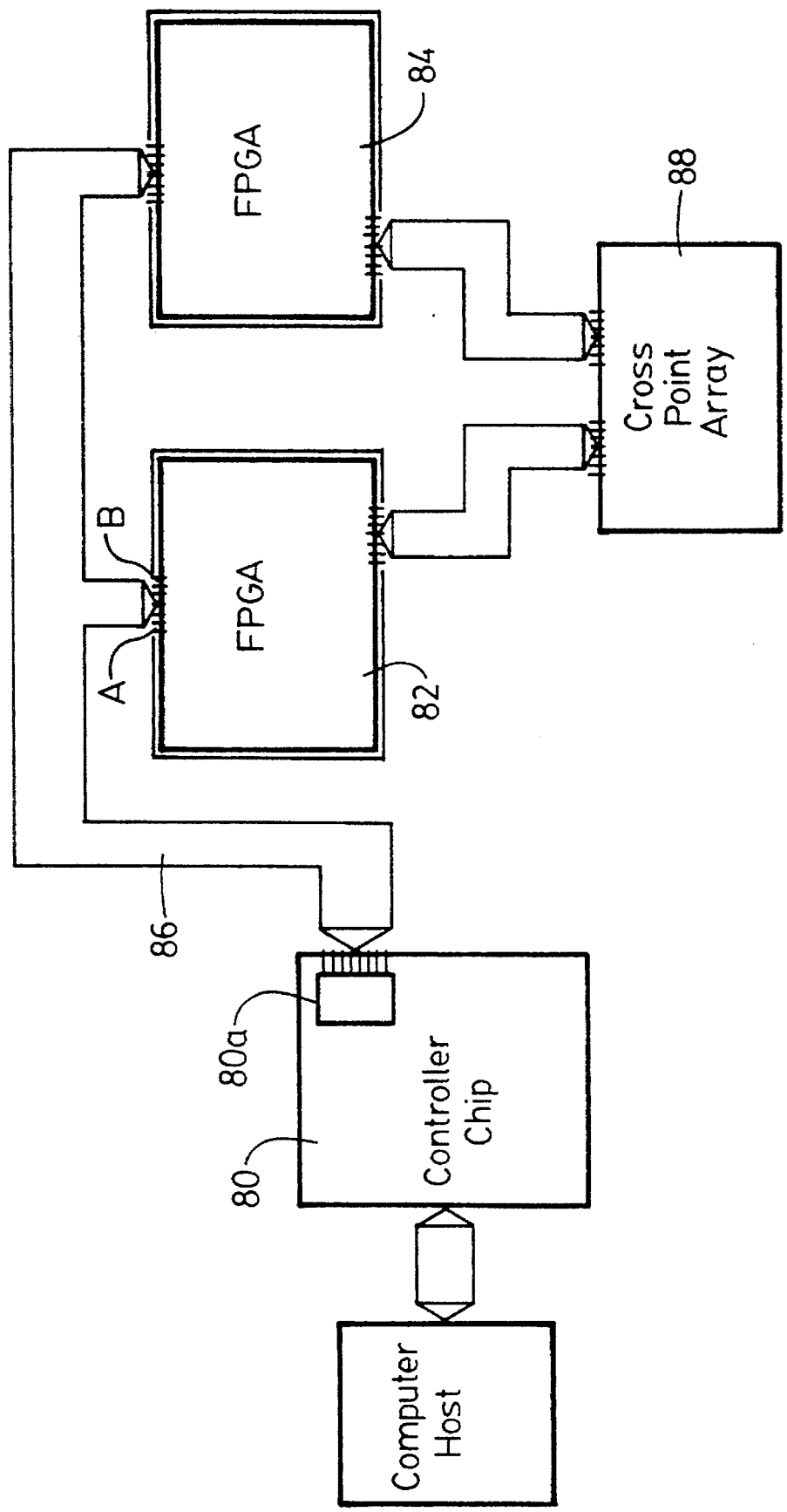
FIG._3.

EMULATION SYSTEM EMPLOYING MOTHERBOARD AND FLEXIBLE DAUGHTERBOARDS

BACKGROUND OF THE INVENTION

This invention relates to the use of multiple field programmable gate arrays (FPGAs) for emulating large circuit designs. In the production of semiconductor chips and systems, it is often desirable to test the circuit design by emulating the circuit design. Field programmable gate arrays allow for the emulation of a portion of a large circuit design. By connecting up a number of the FPGAs, larger circuit designs can be emulated.

One prior art circuit emulating system is described in Butts, et al. U.S. Pat. No. 5,036,473 entitled "Method of Using Electronically Reconfigurable Logic Circuits." A disadvantage of this prior art system is that it is difficult to easily upgrade to more powerful field programmable gate arrays when they become available from a vendor.

It is desired to have a system that easily upgrades to the use of more powerful field programmable gate arrays. Additionally, it is desirable to have a system that can switch among different types of field programmable gate arrays. It would be beneficial to have a system that would be able to support different types of field programmable gate arrays from different vendors.

SUMMARY OF THE INVENTION

The present invention has the advantage that it is a system which can easily upgrade to more powerful field programmable gate arrays as they become available from vendors. This allows the system to be upgraded in power without changing the system's basic structure. Additionally, the present invention involves a system which allows for the use of different types of field programmable gate arrays.

Additionally, the present system allows for the use of core chips directly on the system board. A core chip comprises a very complex block of logic which is eventually embedded on an ASIC chip. Core chips can include microprocessor chips, Digital Signal Processor (DSP) chips, or memory chips. The core chips contain circuitry that is difficult to emulate with FPGAs due to the core chip circuitry's complexity and gate capacity. These core chips connect to other parts of the emulated circuit on the FPGAs. The present invention does not require connecting the core chips to input/output (I/O) ports of the emulation board. In this manner, the present invention has improved flexibility over previous systems.

One embodiment of the present invention that allows these advantages is the use of replaceable daughterboards or cards which connect to a motherboard. The motherboard has sockets for receiving these daughterboards. The sockets have some pin locations allocated to be connected to an emulation bus structure on the motherboard, and some pin locations allocated to be connected to the interconnect structure. These daughterboards can be designed so that the pins correctly line up with the allocated pin locations on the sockets of the motherboards. In this manner, the motherboard need not be changed when the emulation field programmable gate arrays on the daughter cards are upgraded or changed to a different type of field programmable gate array. Additionally, daughter cards could contain core chips.

The emulation field programmable gate arrays on some of the cards have control pins connected to a control chip on the daughter card. This connection allows for the control chip on the daughter card to control the emulation field programmable gate array. In one embodiment, the control chip is configurable so as to control a variety of emulation field programmable gate arrays. Additionally, since the control chip connects to the emulation bus on the motherboard, the emulation FPGAs on the daughter card can be upgraded or switched to different types of FPGAs without affecting the motherboard emulation bus' pin locations. The control chip on the card can then control the new emulation field programmable gate arrays. The configuration data can be loaded into the emulation FPGAs through the control chip. Additionally, the state of the nodes in the field programmable gate arrays can be determined through the control chip. Xilinx-style field programmable gate arrays allow for such readout. The controller chip on the daughter card may be a field programmable gate array. In this manner, the controller chip can be configured for different types of FPGAs or, as discussed below, core chips.

Additionally, the signal pins on the field programmable gate arrays can be connected to the interconnect structure on the motherboard through the dedicated pin locations on the socket connected to the interconnect structure.

Some of the daughter cards can contain core chips, such as microprocessors, DSPs or memories. These cards can also contain a controller chip that can monitor the pins of the core chip. The cards can be set up so that the pins of the core chip go to signal pins of the FPGA controller chip, and in that way can be sent out through the emulation bus to the host computer. The controller chip can also be an FPGA so that different types of core chips could be used with the same cards and the controller chip FPGA could merely be re-programmed.

Another embodiment of the present invention involves the use of an emulation system with bus lines to a field programmable gate array. These field programmable gate arrays can be any one of a group of FPGA types. A configurable interface chip is reconfigurable for interconnecting with a plurality of different types of field programmable gate arrays. For this reason, the control pins on the emulation FPGAs can be connected together with the same bus to different types of field programmable gate arrays. The re-programmable interface on the interface chip allows for an inexpensive emulation system using field programmable gate arrays.

BRIEF DESCRIPTION OF THE DRAWINGS

The above and other features and aspects of the present invention will become more apparent upon the reading of the following detailed description in conjunction with the accompanying drawings, in which:

FIG. 1 is a diagrammatic view of an emulation system of an embodiment of the present invention;

FIGS. 2A–B are flow charts showing a method of using the emulation system of FIG. 1; and FIG. 3 is a diagrammatic view of an alternate emulation system of the present invention.

DETAILED DESCRIPTION OF THE PREFERRED EMBODIMENT

FIG. 1 is a diagrammatic view of the emulation system of the present embodiment of the present invention. Daughterboards or cards 4, 6 and 8 are connected to a motherboard 10 at the sockets 12, 14 and 16. The cards 4, 6 and 8 have pins which attach to the sockets on the motherboard 10. The sockets have allocated pin locations. For example, socket 14 has pin locations 14a which are attached by a bus 20 to a cross point array 22. The socket 14 also has other pin locations 14b, which are attached by a emulation bus 24 to a control chip 26. Other pin locations (not shown) can connect to an Input/Output bus (not shown) or clock bus (not shown). These pin locations can be standardized on the sockets so that daughter cards can be placed into any of the socket locations interchangeably. Similarly, as will be discussed below, the daughter cards have their pins allocated in such a manner that the emulation field programmable gate arrays can be upgraded or switched to a different type, or the core chip can be added to the daughter card without requiring the motherboard to be changed. Different cards can contain different chips with a standardized allocation of card pin allocations. Additionally, as is discussed below, the use of a configurable controller chip 32 may allow chips on the card to be upgraded without changing cards.

The sockets 12, 14 and 16 are arranged so that the daughter cards fit flat on the motherboard, so that the motherboards can fit tightly into a rack system.

Card 4 has emulation field programmable gate arrays 28 and 30 placed thereon. The card could contain different types of field programmable gate arrays. For example, Altera or Xilinx chips could be used. Xilinx chips are described in "The Programmable Gate Array Design Handbook," 1986, and are available from Xilinx, Inc. of San Jose, Calif. Altera chips are available from the Altera Corporation of Santa Clara, Calif. Additionally, upgrades to more powerful FPGAs from the same vendor can also be done without affecting the motherboard 10.

The daughter card 4, which has field programmable gate arrays thereon, can be controlled by a controller chip 32. The controller chip 32 allows for the loading of the configuration data into the field programmable gate arrays and also allows for the states of the nodes in the field programmable gate arrays to be read out through the controller chip in a readback. Fault simulation can be done by putting data including a simulated fault into the field programmable gate arrays 28 and 30 through the controller chip 32. In this manner, the emulated circuit can be used to determine how well test program sets developed for devices can be used to detect manufacturing defects. The values at nodes in the circuit design can be determined, and the circuit design or node values can be changed. The controller chip 32 can be, for example, a field programmable gate array itself, so that it can be configured by its control pins off of the emulation bus 24. Pins 32a include these control pins and other signal pins connected to the emulation bus 24. The other signal pins allow for readback of the nodes in the emulation field programmable gate arrays 28 and 30 out through the emulation bus 24. Signal pins 32b of the controller chip 32 are connected to the control pins 28b and 30b of the emulation field programmable gate arrays 28 and 30. These connections allow the emulation field programmable gate arrays 28 and 30 to be configured and debugged through the controller chip 32. Signal pins such as signal pins 30a of field programmable gate array 30 are connected by the bus 20 to the crosspoint array 22. In this manner, the field programmable gate arrays can be interconnected to emulate circuits.

In the preferred embodiment, daughterboard controller chips such as controller chip 35 are configured such that the controller chip has registers 35c accessible over pins 35a to the emulation bus 24 and a reconfigurable interconnect 35d connected to pins 35b. The registers 35c can include write and read registers. Write registers are written to over the emulation bus 24 and include a control register (sets the mode such as programming mode, configuration mode, readback mode), a reset register, a daughterboard selection register and registers to hold the configuration bytes to be serially loaded into FPGAs 29 or 31. Read registers include a daughterboard status bit and registers to store the readback data from the FPGAs 29 or 31. In a preferred embodiment, eight registers can be written to over bus 24 and eight registers can be read from over bus 24. The registers 35c are connected to control the transfer of data from the emulation bus 24 and to the FPGAs 29 or 31, and vice versa. The controller chip 35 also can be configured such that the connections from the registers 35c to the signal pins 35b can be reconfigured. The reconfigurable interconnect 35d connects pins 35b to the registers 35c. For example, if one of the pins of pins 35b is connected to the readback data pin of FPGA 29, reconfigurable interconnect 35d can route this data to the appropriate register of registers 35c. If a different type of FPGA is used in place of FPGA 29, the readback data pin may be connected to a different pin of the pins 35b. The reconfigurable interconnect 35d allows this different pin to be rerouted to the correct register of registers 35c. This reconfigurable interconnect 35d allows the FPGAs to be upgraded or switched to a different type of FPGA from a different vendor without changing the bus on the daughterboard 6. The configuration of the registers 35c and much of the emulation bus 24 protocol also does not need to change if the FPGAs are changed or upgraded.

Core chips such as core chip 34 can also be placed into the emulated circuit. The core chip 34 can be placed on a daughter card such as daughter card 8. The daughter card 8 is placed right onto the motherboard 10. One does not need to use the I/O pins of the motherboard 10, but can connect the core chip 34 to other parts of the circuit, such as the portions of the emulator circuit placed on the field programmable gate arrays 28 and 30 through the crosspoint array 22. Core chips can be, for example, microprocessors, DSPs or memories. A controller chip 36 is adapted to read the values of the pins 34a on the core chip 34. The values can then be sent back over the emulation bus 24 to the host computer 36 for debugging.

The core chip 34 can have special pins 34b that can allow for the internal investigation of circuit nodes in the core chip 34 by the controller chip 36. The controller chip 36 can be a field programmable gate array having control and signal pins 36a connected to the emulation bus 24 and signal pins 36b connected to read the values on the core chip 34. Additionally, signal pins 36c can be adapted to control the reading of the internal workings of the core chip 34. The controller chip 36 can be reconfigured for different types of core chips. This may or may not require a different type of card bus structure for different core chips.

The crosspoint array 22 is connected to the emulation field programmable gate arrays 28 and 30 and the core chips, such as core chip 34, on the daughter cards by the bus 20. This crosspoint array 22 can be used for interconnecting the circuitry. The crosspoint array 22 can be configured over the emulation bus 24.

The crosspoint array 22 is connected so that the signal transmission delay time through the crosspoint array is minimized. Because of this transmission delay time, paths for which timing is critical should be routed through the global bus (not shown) or placed on a single daughter card. The crosspoint array 22 can be comprised of an array of field programmable gate arrays.

Tester interface 38 can also be constructed of field programmable gate arrays. The tester interface 38 can aid in the testing of the system. The system can support standard test vectors. Additionally, automatic vector compare in the host computer 40 can be aided by the tester interface 38.

The controller chip 26 for the motherboard 10 is connected to the emulation bus 24 to aid in the configuration loading of the chips on the daughter cards 4, 6 and 8, and for the debugging and fault testing of the emulated circuit. The controller chip 26 forms the interface with the host computer 40. The controller chip 26 can be an FPGA that is configured upon boot-up by a programmable read-only memory (PROM) 42 that stores the configuration data of the controller chip 26. Upon boot-up, the configuration data for other controller chips on the daughter cards or motherboard can be loaded through the controller chip 26 to these other controller chips such as controller chips 32 and 36 or controller chips (not shown) for the crosspoint array or tester interface.

The controller chip 26 is connected to the host computer 40. Additional motherboards, such as the additional motherboard 44, can also be hooked to the host computer 40.

In a preferred embodiment, daughter cards have two emulation FPGAs. These emulation FPGAs can be Xilinx XC4010 chips or Altera 81500 chips. One hundred forty-four pins of each Xilinx XC4010 chip are sent via the bus 20 to the crosspoint array 22, eight possible connections to each of the eighteen XC3090 Xilinx chips in the crosspoint array 22. Thirty-two of the signal pins on each XC4010 are connected to an I/O bus (not shown). The controller chips, such as controller chip 32 on the daughter card 4, can be a smaller Xilinx chip. The crosspoint array 22 can be comprised of eighteen XC3090 Xilinx chips. An eight-bit wide global bus (not shown) is also provided to each chip on the motherboard 10 and the daughterboards. This global bus is used for clock distribution and other high fanout nets. The global bus is buffered into five parallel chains. The tester interface 38 can be comprised of eight XC3090 Xilinx chips.

In the preferred embodiment, the daughter cards have six 60-pin connectors, giving a total of 360 pins, and can support analog or digital components. The pin connectors are arranged with uneven spacings to prevent plugging in the daughter cards the wrong way. Each motherboard can hold eight of the daughterboards, and can support four 160-pin connectors and host display interfaces. A rack system can hold two or more motherboards.

The host computer may be an IBM-compatible PC and host interface controller card. The compilation software resides on a SUN workstation.

FIGS. 2A–B are flow charts showing the method of using the emulation system of FIG. 1. Step 50 shows the step of obtaining a circuit design net list of a circuit to be emulated. At the same time, this design can be translated to circuit descriptions which are allowed for the type of emulation field programmable gate arrays which are to be used. Additionally, in step 52, the location and contents of the cards on the motherboard is input into the system. In this step, the position and contents of the daughter cards are input into the host computer 40. This can be done manually or by polling the daughter cards. In step 54, the controller chip 26 is configured on the motherboard 10. This can be done by loading the configuration data from the host computer 40 or by loading the configuration data from the PROM 42.

In step 56, the controller chips on the daughterboards, such as controller chip 32, are configured for the type of field programmable gate array on that daughterboard. In step 58, the controller chips 36 on the daughterboards that have core chips are configured. In step 60, the net list of the circuit design is partitioned, and the pin assignments are determined. The host computer 40 provides multiple types of partitioning. Timing constraint partitioning gives the user detailed control on the design with a capacity to reallocate timing of critical parts onto a specific FPGA device or emulation cards. Timing constraint partitioning results in the highest emulation timing performance. In cluster-based partitioning, groups of logic blocks or primitive gates within a design which should be connected together can be clustered. This algorithm can be used to cluster together all logic gates connected to a given clock line or to identify a critical path in the design. Finally, a fully automatic partitioning algorithm can be used. This fully automatic algorithm provides the capacity to partition the design onto an array of field programmable gate array devices. This algorithm is optimized to offer minimum interconnect between the field programmable gate array devices with high utilization per field programmable gate array device. To partition the design onto an array of field programmable gate array devices, a combination of the partitioning algorithms described above can be used. For example, the timing of critical parts may be assigned using the timing constraint method, and the rest of the design, which is not time critical, can be partitioned by the automatic algorithm. A general discussion of partitioning is given by U.Kodres in Chapter 4, entitled "Partitioning and Card Selection," of the textbook *Design Automation of Digital Systems*, which is incorporated herein by reference.

In step 62, the routing of the emulation circuit through the crosspoint array 22 including the assigning of different pins of the emulation field programmable gate arrays is done. In step 64, the field programmable gate array configuration data for the circuit-emulation FPGAs is compiled and loaded through the motherboard and daughterboard controller chips. The field programmable gate arrays have their own compiler software that can be stored in the host computer 40 so that the FPGA configuration data can be produced. The FPGA compiler software can be obtained from the FPGA vendor or from independent sources. In step 66, the FPGA configuration data for the crosspoint arrays FPGA's is compiled and loaded from the motherboard. At this point, the system is ready for the emulation to be run in step 68. In step 70, debugging is now possible. The state of the nodes in the emulation can be determined through the daughterboard chip controllers. During the debugging phase, the system provides the capacity to probe internal nodes of the design. The temporary logic needed to probe local circuits is automatically added and removed via graphical user interface. This temporary logic can be stored in the tester interface 38. The system allows for test vector verification capacity and allows the user to download their test vectors into the system and compare these results against the simulation results. This system can also provide an interface to the user's existing software simulator, or vary the compiled design prior to emulation. This gives the capacity to simulate the design complete with fully back-annotated timing information. This system can also provide an interface to a user's existing timing analyzer. This gives the capacity to analyze the partition design for hold violations, and predict the maximum speed of the emulated design. The existing pad system provides more accurate results using industry standard and mature products. The entry-level emulation is much cheaper with this system, as the system works within the existing computer-aided design framework rather than replacing it.

In step 72, the changes to the design (i.e., stuck at nodes) may be put into the emulation FPGA's, if these FPGA's are configurable. This allows for fault simulation to occur.

Step 74 shows the benefit in that the field programmable gate arrays on the daughterboards can be upgraded or additional daughterboards can be added as the system needs increase.

FIG. 3 is a diagrammatic view of an alternate emulation system. This system uses a controller chip 80 that contains a reconfigurable interface 80a. Since the interface 80a is reconfigurable, different types of field programmable gate arrays can be used with the system. For example, field programmable gate arrays 82 and 84 are connected by system bus 86 to the reconfigurable interface 80a. Different types of field programmable gate arrays that fit into the same footprint can be used at different times using the same bus 86, since the controller chip 80 includes the reconfigurable interconnect 80a. Supposing that pin location A is the location of the serial configuration loading pin on one type of field programmable gate array, but that the pin location B is the location of the serial configuration loading pin on another type of field programmable gate array, the reconfigurable interface 80a can send the serial data information to the pin location A for one type of field programmable gate array but to pin location B for the other type of field programmable gate array. The use of the reconfigurable interconnect 80a allows for a cheap system for the connection of a few large field programmable gate arrays. The reconfigurable interconnect 80a allows for a simple bus structure 86 to be used to interconnect different types of field programmable gate arrays at different times. The reconfigurable interconnect 80a can be part of the circuitry on a field programmable gate array.

A crosspoint array 88 can be used to interconnect the field programmable gate arrays 82 and 84. Alternately, hardwired interconnections could be used. Similarly, a reconfigurable interconnect 35d can be used in a controller chip 35 on the daughter cards as shown in FIG. 1.

Various details of the implementation and method are merely illustrative of the invention. It will be understood that various changes of details may be within the scope of the invention, which is to be limited only by the appended claims.

What is claimed is:

1. An emulation system for emulating a circuit design comprising:
    (a) a motherboard having a plurality of sockets, said sockets including first pin group locations electrically connected to an interconnect structure and second pin group locations electrically connected to a busing structure; and
    (b) at least one card with
        (i) pins arranged such that the card can be attached to a socket of said sockets, the pins including a first pin group arranged to contact the first pin group locations of a socket and a second pin group arranged to contact the second pin group locations of the socket,
        (ii) at least one field programmable gate array for emulating a portion of the circuit design, said at least one field programmable gate array including signal pins, some of the signal pins electrically connected to pins of the first pin group on the card, and
        (iii) a card controller chip, said card controller chip being electrically connected to control pins of the at least one field programmable gate array, the card controller chip loading configuration data into said at least one field programmable gate array, said card controller chip including control pins, some of the control pins electrically connected to pins of the first pin group on the card.

2. The emulation system of claim 1, wherein said field programmable gate array is of a type selected from a plurality of different types of field programmable gate arrays and wherein said card controller chip can be configured to load configuration data to each of the different types of field programmable gate arrays.

3. The emulation system of claim 2, wherein the card controller chip comprises another field programmable gate array, said another field programmable gate array being configurable through said busing structure.

4. The emulation system of claim 1, wherein said busing structure comprises a motherboard controller chip, said motherboard controller chip electrically connected to a host computer to load the configuration data to the card controller chips on the cards.

5. The emulation system of claim 1, further comprising an additional card attachable to said sockets, said additional cards including a core chip, said core chip being part of the emulated design, wherein, when the card is attached to a socket, pins of said core chip are electrically connected to the first pin group locations of the socket.

6. The emulation system of claim 5, wherein said core chip is a memory chip.

7. The emulation system of claim 5, wherein said core chip is a microprocessor chip.

8. The emulation system of claim 5, wherein said additional card further comprises an additional field programmable gate array attached to said busing structure, said additional field programmable gate array being electrically connected to pins of the core chip so that the core chip can be controlled from the busing structure and so that the state of some of the pins on the core chip can be determined.

9. The emulation system of claim 8, wherein said core chip can be controlled to output the state of at least one internal node of the core chip onto one of the core chip's pins so that the state of said node can be output on said busing structure.

10. The emulation system of claim 1, wherein said interconnect structure comprises an array of further field programmable gate array chips on the motherboards, and wherein said array is arrange to electrically interconnect pin locations on different sockets.

11. The emulation system of claim 1, wherein the card controller chip allows testing and fault simulation of the portion of the circuit design emulated on the field programmable gate array.

12. The emulation system of claim 1, further comprising a computer host connected to said busing system, said computer host being able to configure, test and do fault simulation on the emulation system.

13. The emulation system of claim 1, further comprising an additional motherboard with associated cards, said additional motherboard and said motherboard connected together by a rack.

14. An emulation system comprising:
    bus lines electrically connecting a chip footprint and a configurable interconnect chip, said chip footprint arranged such that the chip footprint can accept a plurality of different candidate types of field programmable gate array chips;
    said configurable interface chip configurable into one of a plurality of different configurations, each different configuration corresponding to one of said candidate types such that for each different type, the interface chip can be configured to control a field programmable gate array of that type over said bus lines; and
    a field programmable gate array of one of said different candidate of types placed in said chip footprint, said field programmable gate array able to emulate a portion of a circuit design, wherein the configurable interface chip is configured for the type of field programmable gate array placed in the chip footprint.

15. The emulation system of claim 14 wherein said configurable interface chip, said bus line and said field programmable gate array are on a card, said card having pins arranged to fit into a socket of a motherboard; wherein said configurable interconnect chip is electrically connected to a busing structure on the motherboard; and wherein the field programmable gate array has pins, some of the pins of the field programmable gate array are electrically connected to an interconnect structure on the motherboard.

16. The emulation system of claim 14, further comprising additional field programmable gate arrays of said one of said different candidate types, said additional field programmable gate arrays are able to emulate another portion of the circuit design, said additional field programmable gate arrays are located in footprints connected to the bus lines, and wherein said configurable interface chip controls said additional field programmable gate arrays.

17. The emulation system of claim 16, wherein the configurable interface chip is connected to a host computer.

18. The emulation system of claim 17, further comprising an interconnect connecting some of the signal pins of the field programmable gate arrays together.

19. The emulation system of claim 18, wherein said interconnect comprises an array of field programmable gate arrays.

20. The emulation system of claim 14, wherein the plurality of different candidate types of field programmable gate array chips includes types having a control pin for the same function at different pin locations and wherein the configurable interface chip is configurable to supply signals to the control pin at different pin locations depending what type of field programmable gate array is in the chip footprint.

21. A method of emulating a circuit comprising:

providing a reconfigurable controller chip connected to a host processor, said reconfigurable controller chip connected by a bus structure to at least two field programmable gate arrays of a first type, said field programmable gate arrays having control pins;

routing the reconfigurable controller chip so that control pins of the at least two field programmable gate arrays are accessible by said host processor;

loading configuration data to the at least two field programmable gate arrays through the reconfigurable controller chip to emulate a portion of a circuit;

replacing the at least two field programmable gate arrays with another at least two field programmable gate arrays of a second type having control pins, at least one being in a different pin location than the corresponding control pin on the field programmable gate arrays of the first type;

rerouting the reconfigurable controller chip so that control pins of the another at least two field programmable gate arrays are accessible by said host processor; and loading configuration data to the another at least two field programmable gate arrays through the reconfigurable controller chip to emulate another portion of a circuit.

22. The method of claim 21, wherein the at least two field programmable gate arrays of the first type and the reconfigurable controller chip are provided on a card and said replacing step comprises replacing the at least two field programmable gate arrays with another at least two field programmable gate arrays of a second type on the daughter card, the method further comprising placing the card in a socket on a motherboard, the motherboard being electrically connected to the host processor.

23. The method of claim 22, wherein said configuration loading steps further comprises connecting some of the signal pins of the field programmable gate arrays together in an array of field programmable gate arrays.

* * * * *

UNITED STATES PATENT AND TRADEMARK OFFICE
CERTIFICATE OF CORRECTION

PATENT NO. : 5,604,888
DATED : February 18, 1997
INVENTOR(S) : Kiani-Shabestari et al.

It is certified that error appears in the above-indentified patent and that said Letters Patent is hereby corrected as shown below:

On the Title Page, item [56], replace:
"[56] 2179372 of 1987 United Kingdom"

With
--[56] 2180382 of 1987 United Kingdom--

In Column 9, line 17, Claim 16:
replace "gate arrays are able to emulate another portion of the circuit"

With
--gate arrays able to emulate another portion of the circuit--

Signed and Sealed this

Third Day of March, 1998

Attest:

BRUCE LEHMAN

*Attesting Officer*     *Commissioner of Patents and Trademarks*